United States Patent [19]

Fair et al.

[11] 4,033,027

[45] July 5, 1977

[54] DIVIDING METAL PLATED SEMICONDUCTOR WAFERS

[75] Inventors: Richard Barton Fair, Sinking Spring; John Saylor Hayes, Fleetwood; William Morgan Rosser, Sweet Valley, all of Pa.

[73] Assignee: Bell Telephone Laboratories, Incorporated, Murray Hill, N.J.

[22] Filed: Sept. 26, 1975

[21] Appl. No.: 617,036

[52] U.S. Cl. .................................. 29/583; 29/591
[51] Int. Cl.² ........................................... B01J 17/00
[58] Field of Search ................. 29/583, 578, 591

[56] References Cited

UNITED STATES PATENTS

| | | | |
|---|---|---|---|
| 2,784,479 | 3/1957 | Roberts | 29/583 |
| 2,814,853 | 12/1957 | Paskell | 29/583 |
| 3,720,997 | 3/1973 | Black | 29/583 |
| 3,934,331 | 1/1976 | Sugiyama | 29/583 |

*Primary Examiner* — W. Tupman
*Attorney, Agent, or Firm* — H. W. Lockhart

[57] ABSTRACT

A process for fabricating semiconductor devices is disclosed. In particular, a method for separating semiconductor wafers into device chips includes the step of forming a photoresist grid pattern underlying the metallization layer on the back face of the wafer. Mechanical means, such as scribing or sawing, are used to penetrate the metal layer, the underlying photoresist layer, and at least a portion of the semiconductor body. Separation then is completed either by breaking, further sawing or etching. The process enables a clean separation to be made through fairly heavy gold or gold alloy coatings which is particularly advantageous for devices which are to be eutectic-bonded to mounting platforms.

5 Claims, 5 Drawing Figures

DIVIDING METAL PLATED SEMICONDUCTOR WAFERS

BACKGROUND OF THE INVENTION

This invention relates to the fabrication of the semiconductor devices and more particularly to the separation of semiconductor wafers into device chips. Wafer separation is a well developed art and involves various mechanical techniques including scribing and breaking, as well as various sawing methods. More recently laser cutting has also been utilized. Certain types of devices require processes of photoresist masking and chemical etching to satisfactorily divide the wafer with its plurality of device chips into individual devices. There are, of course, combinations of the foregoing techniques, for example, a combination of scribing or sawing and chemical etching may be used.

However, certain semiconductor devices, particularly those in which the chip must be intimately connected over a relatively large area to the mounting base in order to provide good thermal conductance, require a relatively heavy coating of gold or gold alloy on the back surface of the chip to enable a eutectic bond to be made at a relatively low temperature. It is impractical to attempt to provide the metal plating at a stage other than in the large wafer form. However, pure gold and useful gold alloys are difficult to penetrate cleanly because of their relative softness and ductility. At least one effort of the prior art involves a series of treatments to first embrittle a gold plating to enable chip separation by conventional means followed by a treatment to reproduce the original state of ductility. This technique as well as other expedients obviously introduce additional process steps which are disadvantageous, particularly those that involve heating operations.

Accordingly, an object of this invention is a method of separating semiconductor wafers having relatively heavy gold or gold alloy platings into device chips by conventional means by the addition of a simple processing step not involving heat treatment or other deleterious effect.

SUMMARY OF THE INVENTION

In a specific embodiment in accordance with this invention, a semiconductor wafer has been completely processed to form a plurality of devices in the portion adjoining one surface of the wafer, hereinafter referred to as the active surface, has a photoresist grid formed on the opposite or back surface. This photoresist grid is formed by conventional photolithographic techniques and is aligned with the device boundaries along which the wafer is to be separated into chips.

A layer of metallization then is provided on the back surface adhering to the semiconductor material and overlying the photoresist grid pattern. In a specific embodiment in which the semiconductor body is of single crystal gallium arsenide, the metallization layer comprises a thin film of titanium, followed by a slightly thicker layer of platinum, and finally a relatively heavy layer of gold. The wafer then is suitably mounted and mechanical means are applied to cut or scribe through the metal layer in a pattern conforming to the underlying photoresist grid pattern. Because of the underlying photoresist material the metal film is penetrated relatively precisely and cleanly. The cutting or scribing continues through the photoresist material and into at least a portion of the underlying semiconductor body.

In accordance with some procedures in which saw cutting is used, the cutting may continue entirely through the semiconductor wafer. If partial cutting or scribing is used, the wafer is divided finally by well-known breaking techniques to produce the plurality of device chips of which the wafer is comprised.

The separated chips exhibit relatively clean back edges where the metal coating occurs and are of an advantageous configuration for eutectic bonding to a plated mounting platform.

BRIEF DESCRIPTION OF THE DRAWING

The invention and its other objects and features will be more clearly understood from the following detailed description taken in connection with the drawing in which.

DETAILED DESCRIPTION

Figure 1:
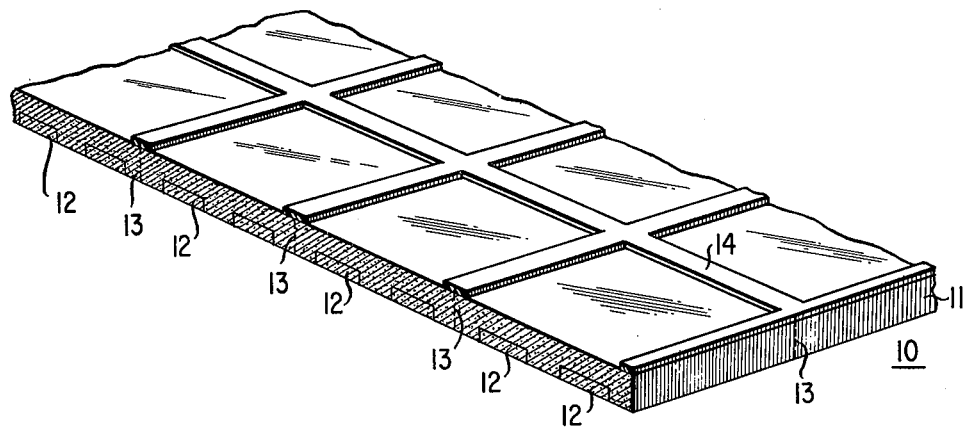
FIG. 1 is a perspective view, partially in section, of a portion of a semiconductor wafer having a photoresist grid pattern formed therein in accordance with one embodiment of this invention.

FIG. 1 depicts a portion of a semiconductor wafer 10. Such a wafer may be of any of the conventional semiconductor materials including silicon, germanium and compounds of the III–V and II–VI groups. In this particular embodiment a process used in connection with the fabrication of a high frequency, relatively high power field effect transistor fabricated using single crystal gallium arsenide is described. Accordingly, the body 11 is a portion of a wafer of gallium arsenide. In a portion of the wafer adjoining one surface of the wafer, as indicated by the conductivity type zones 12, is an array of identical device structures produced by well known processing techniques such as diffusion, or ion implantation as well as selective metallization on the active surface to form interconnections and contacts. Such metallization patterns are not shown in order to simplify the drawing.

On the back surface of the wafer opposite the active surface and aligned with the broken lines 13 indicating the device chip boundaries there is formed a photoresist grid pattern 14. This pattern 14 is formed by standard photolithographic techniques well known in the semiconductor art utilizing either positive or negative photoresist materials. Alignment with the device boundaries, which are observable more clearly on the active surface of the wafer, is accomplished in one procedure using infrared lighting to align the mask on the back surface. The photoresist layer need have only the usual thickness of several thousand angstroms in order to be satisfactory for the purposes of this invention.

Figure 2:
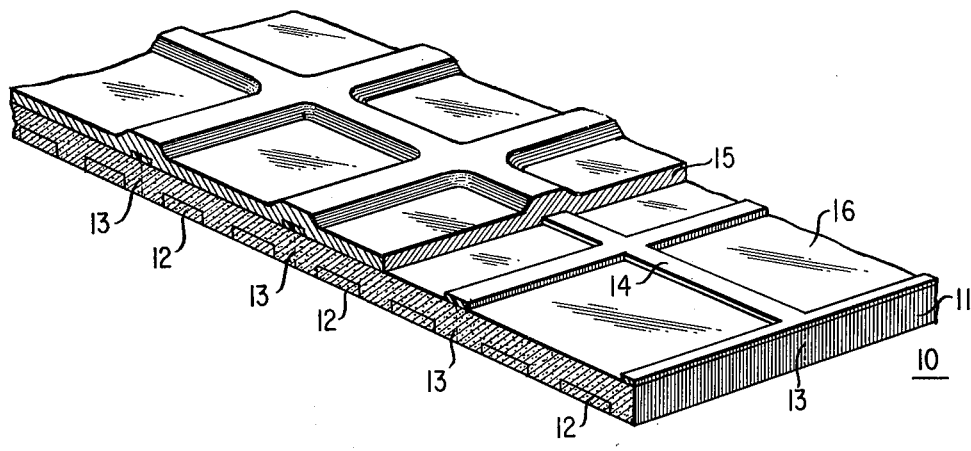
FIG. 2 is a similar view showing the wafer portion after the application of a metallization layer.

FIG. 2 depicts the wafer portion following the application of the metallization layer 15 to the entire back surface 16 of the wafer. In this specific embodiment a thin layer of titanium is first applied having a thickness of from 200 to 500 angstroms for the purpose of providing good adhesion to the semiconductor material. Following this a film of platinum typically of about 2,000 angstroms thickness is applied over the entire titanium surface. Finally, a heavier film of gold which may be of the order of 5,000 angstroms is deposited. These metal films may be applied by conventional means, including the various evaporation techniques including electron gun deposition. It is desirable at this stage to avoid undue heating and accordingly relatively "cold" techniques for deposition are advantageous.

Figure 3:
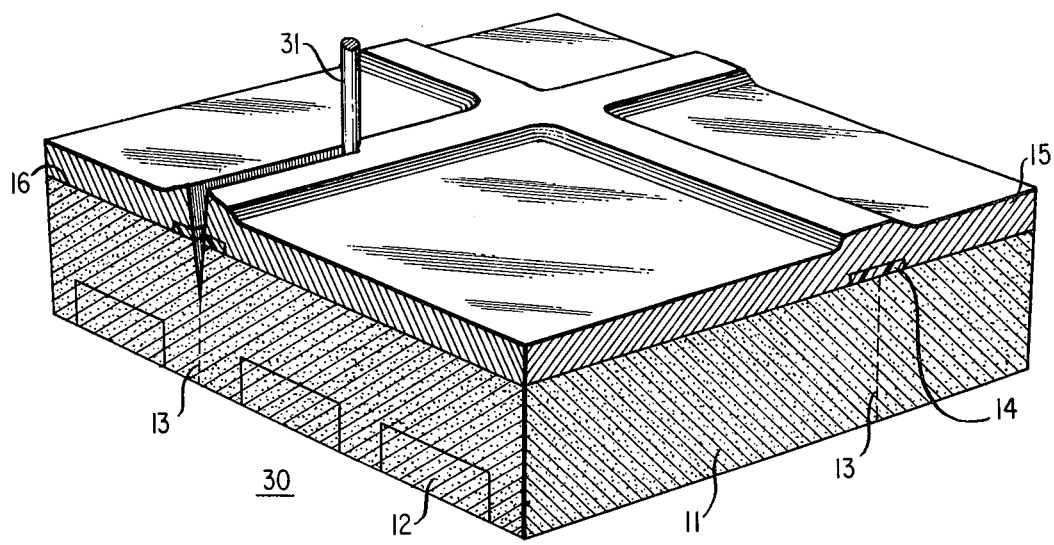
FIG. 3 is a similar view in which the mechanical penetration of the metal layer is depicted.

Next the wafer is suitably mounted for scribing or sawing along the lines of separation. In the wafer portion 30 shown in FIG. 3 a scribing tool 31 is used to penetrate the metal layer 15 as well as the photoresist grid 14 and a portion of the semiconductor body 11 from the active surface 16. In this specific embodiment the scribe and break technique is used and consequently only a portion of the semiconductor body is penetrated by the scribing tool 13. Alternatively, a tool such as a saw may be used to cut entirely through the semiconductor body to complete the chip separation. Other alternatives including selective etching also may be used.

Figure 4:
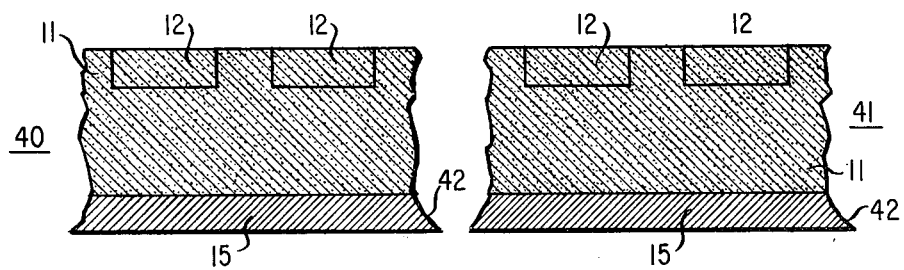
FIG. 4 shows several of the device chips into which the wafer of FIGS. 1 through 3 has been separated.
Figure 5:
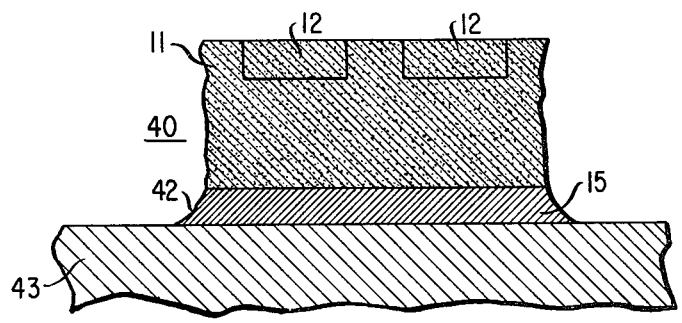
FIG. 5 shows a device chip bonded to a mounting platform.

After the entire grid pattern has been scribed, the wafer is soaked in a suitable solvent such as acetone, or placed in an oxygen plasma at low power (~50 watts), to remove the remaining photoresist material now exposed under the scribed metal layer. Finally, the scribed wafer is broken into individual device chips by conventional means, typically by retaining the wafer between mylar sheets and rolling the wafer over a rounded corner or otherwise applying mechanical stress to the wafer to cause it to break along the scribed lines. Silicon wafers can be etched apart by plasma etching using a mixture of $CF_4$ and oxygen. Finally, as shown in FIG. 4, and after cleaning in suitable solvent, the individual device chips 40–41a each have a good adherent metal plating 15 on the back surface with some degree of desirable overhang 42 of the metal film 15. This metal overhang 42 is advantageous because upon mounting and heating to produce a eutectic bond it provides a desirable metal fillet around the boundary of the bond as shown in FIG. 5. The device chip 40 is bonded in good thermal and electrical contact with the mounting platform 43 through the plating 15 with the desirably smooth continuous fillet 43.

Although the invention has been disclosed in terms of a specific embodiment and certain specific materials, it will be apparent to those skilled in the art that variations may be practiced which are still within the scope and spirit of the invention. In particular, the metallization layer may omit the films of the thinner metals or may substitute other metals of similar characteristics. For example, palladium may be used in place of platinum. A material such as zirconium may be substituted for titanium. However, gold or a suitable gold alloy is significant to this invention as it provides the basis for the desired mounting arrangement. In place of pure gold, alloys of gold and germanium, or gold and metals such as antimony, arsenic, indium and the like may be utilized.

What is claimed is:

1. A process for fabricating semiconductor devices from a semiconductor wafer having a pair of opposed major surfaces comprising, (1) first forming a plurality of devices in a portion of the wafer adjacent one surface thereof, (2) next forming on the opposite surface of said wafer a photoresist pattern conforming to the separation lines between said devices, (3) next applying a layer of metal including at least one selected from the group comprising gold or an alloy of gold on said opposite surface and overlying said photoresist pattern, (4) applying mechanical cutting means to penetrate said metal layer, said photoresist pattern and at least a portion of said semiconductor body in accordance with said photoresist pattern, and (5) dividing said semiconductor wafer into a plurality of semiconductor devices in accordance with said pattern.

2. The process in accordance with claim 1 in which applying a layer of metal comprises applying a first thin film of titanium, a second slightly thicker film of platinum, and a thicker film of gold.

3. The process in accordance with claim 1 in which the mechanical cutting means penetrates only a portion of said semiconductor body and said wafer is divided by breaking.

4. The process in accordance with claim 3 in which the mechanical cutting means is sawing.

5. The process in accordance with claim 1 in which sawing is used to penetrate entirely through said semiconductor body thereby dividing said semiconductor wafer into a plurality of semiconductor devices in accordance with said pattern.

* * * * *